US010283553B2

(12) United States Patent
Webster et al.

(10) Patent No.: US 10,283,553 B2
(45) Date of Patent: May 7, 2019

(54) VISIBLE AND INFRARED IMAGE SENSOR

(71) Applicant: OMNIVISION TECHNOLOGIES, INC., Santa Clara, CA (US)

(72) Inventors: Eric A. G. Webster, Mountain View, CA (US); Howard E. Rhodes, Nokomis, FL (US); Dominic Massetti, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 6 days.

(21) Appl. No.: 15/717,071

(22) Filed: Sep. 27, 2017

(65) Prior Publication Data

US 2018/0019278 A1    Jan. 18, 2018

Related U.S. Application Data

(62) Division of application No. 14/341,257, filed on Jul. 25, 2014, now Pat. No. 9,806,122.

(51) Int. Cl.
*H01L 27/00*    (2006.01)
*H01L 27/146*    (2006.01)
*H01L 31/028*    (2006.01)

(52) U.S. Cl.
CPC .... *H01L 27/14645* (2013.01); *H01L 27/1462* (2013.01); *H01L 27/1463* (2013.01); *H01L 27/14621* (2013.01); *H01L 27/14632* (2013.01); *H01L 27/14649* (2013.01); *H01L 27/14652* (2013.01); *H01L 27/14685* (2013.01); *H01L 27/14687* (2013.01); *H01L 27/14689* (2013.01); *H01L 31/028* (2013.01)

(58) Field of Classification Search
CPC .................................................. H01L 27/14621
See application file for complete search history.

(56) References Cited

U.S. PATENT DOCUMENTS

| 5,453,611 | A | 9/1995 | Oozu et al. |
| 5,801,373 | A | 9/1998 | Oozu et al. |
| 6,958,194 | B1 | 10/2005 | Hopper et al. |

(Continued)

OTHER PUBLICATIONS

First Chinese Office Action dated Oct. 31, 2017, for Chinese Application No. 201410817565.9, filed Dec. 24, 2014, 12 pages.

(Continued)

*Primary Examiner* — Mounir S Amer
*Assistant Examiner* — Alexander Belousov
(74) *Attorney, Agent, or Firm* — Christensen O'Connor Johnson Kindness PLLC

(57) ABSTRACT

A method of image sensor fabrication includes forming a second semiconductor layer on a back side of a first semiconductor layer. The method also includes forming one or more groups of pixels disposed in a front side of the first semiconductor layer. The one or more groups of pixels include a first portion of pixels separated from the second semiconductor layer by a spacer region, and a second portion of pixels, where a first doped region of the second portion of pixels is in contact with the second semiconductor layer. Pinning wells are also formed and separate individual pixels in the one or more groups of pixels, and the pinning wells extend through the first semiconductor layer. Deep pinning wells are also formed and separate the one or more groups of pixels.

8 Claims, 4 Drawing Sheets

(56) References Cited

U.S. PATENT DOCUMENTS

| | | |
|---|---|---|
| 7,250,359 B2 | 7/2007 | Fitzgerald |
| 7,910,961 B2 | 3/2011 | Mao et al. |
| 8,471,313 B2 | 6/2013 | Takahashi |
| 8,587,040 B2 | 11/2013 | Kobayashi et al. |
| 9,197,829 B2 | 11/2015 | Kobayashi et al. |
| 9,613,997 B2 | 4/2017 | Kobayashi et al. |
| 9,647,024 B2 | 5/2017 | Kobayashi et al. |
| 2005/0006565 A1 | 1/2005 | Mouli |
| 2006/0157806 A1 | 7/2006 | Rhodes |
| 2009/0152604 A1 | 6/2009 | Zhu et al. |
| 2010/0102206 A1 | 4/2010 | Cazaux et al. |
| 2010/0102366 A1 | 4/2010 | Lee et al. |
| 2011/0169991 A1 | 7/2011 | Ku et al. |
| 2014/0184808 A1* | 7/2014 | Ryoki ............... H01L 27/14621 348/164 |
| 2014/0184810 A1 | 7/2014 | Sekiguchi |
| 2015/0249109 A1* | 9/2015 | Wang ............... H01L 27/14621 438/70 |
| 2017/0133421 A1 | 5/2017 | Kobayashi et al. |

OTHER PUBLICATIONS

EP Patent Application No. 15177089.8—Partial European Search Report, dated Mar. 24, 2016, 8 pages.

TW Patent Application No. 103138108—Taiwanese Office Action and Search Report, dated Nov. 30, 2016, with English Translation, 6 pages.

Bean, "Strained-Layer Epitaxy of Germanium-Silicon Alloys," Science, vol. 230, No. 4722, Oct. 11, 1985, pp. 127-140.

Lyu et al., "IR/Color Composite Image Sensor with VIPS (Vertically Integrated Photodiode Structure)," IEEE Image Sensor Workshop, 2007, pp. 267-270.

Sood et al., "Development of Low Dark Current SiGe-Detector Arrays for Visible-NIR Imaging Sensor," Infrared Technology and Applications XXXV, Proc. of SPIE, vol. 7298, 2009, pp. 72983D-1-72983D-11.

EP Patent Application No. 15177089.8—Extended European Search Report, dated Jul. 21, 2016, 14 pages.

* cited by examiner

VISIBLE AND INFRARED IMAGE SENSOR

REFERENCE TO RELATED APPLICATIONS

This application is a divisional of and claims priority to U.S. patent application Ser. No. 14/341,257, filed Jul. 25, 2014, now pending. U.S. patent application Ser. No. 14/341, 257 is hereby incorporated by reference.

TECHNICAL FIELD

This disclosure relates generally to image sensors, and in particular but not exclusively, relates to visible and infrared image sensors.

BACKGROUND INFORMATION

An image sensor is an electronic device that converts light (in the form of an optical image) into electronic signals. Semiconductor based image sensors have become ubiquitous in modern electronic devices such as cell phones, portable cameras, and desktop/laptop computers. Modern image sensors are generally semiconductor charge-coupled devices (CCD), active pixel sensors in complementary metal-oxide-semiconductor (CMOS), or N-type metal-oxide-semiconductor (NMOS) technologies. Typically these devices are used to capture visible light; however, in certain applications detection of light outside of the visible spectrum is desirable.

Infrared (IR) light is one part of the electromagnetic spectrum. All objects emit some amount of black body radiation as a function of their temperature. Generally, the higher the object's temperature, the more IR light is emitted as black-body radiation. An image sensor made to detect IR works even in total darkness because no ambient light is required. Accordingly, an IR image sensor may be helpful in rescue operations, night time photography, and other dark conditions.

Even more useful than an image sensor that can only detect infrared light, is an image sensor that can detect both IR and visible light. However, detection of infrared light generally requires low-band gap materials that are difficult to integrate with traditional image sensor fabrication processes. Accordingly, it has proved challenging to merge infrared and visible imaging technologies. This difficulty in fabricating hybrid visible-IR image sensors has resulted in hybrid sensors that suffer from low IR sensitivity, visible light contamination, semiconductor defects, and the like.

BRIEF DESCRIPTION OF THE DRAWINGS

Non-limiting and non-exhaustive examples of the invention are described with reference to the following figures, wherein like reference numerals refer to like parts throughout the various views unless otherwise specified.

DETAILED DESCRIPTION

Examples of a system and method for forming a visible and infrared (hereinafter "IR") image sensor are described herein. In the following description, numerous specific details are set forth to provide a thorough understanding of the examples. One skilled in the relevant art, having the benefit of the present disclosure will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one embodiment of the present invention. Thus, the appearances of the phrases "in one example" or "in one embodiment" in various places throughout this specification are not necessarily all referring to the same embodiment. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that elements and compounds are referred to by their proper name or elemental symbol interchangeably (e.g. silicon vs. Si).

Figure 1:
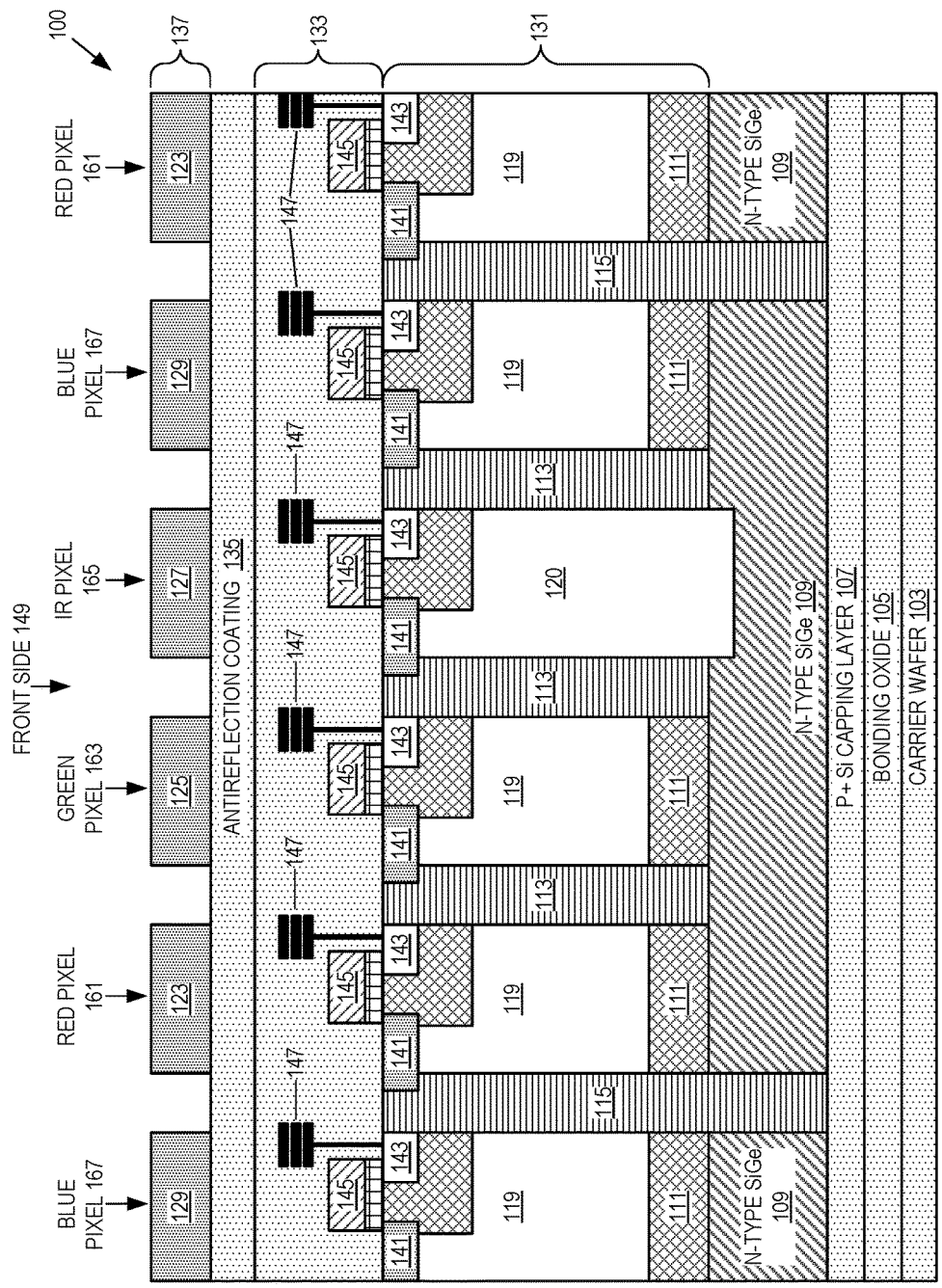
FIG. 1 is a cross sectional view of an example of a visible and infrared image sensor pixel array, in accordance with the teachings of the present invention.

FIG. 1 is a cross sectional view of an example of a visible and infrared image sensor pixel array 100 (hereinafter "pixel array"), in accordance with the teachings of the present invention. Pixel array 100 includes an $Si_xGe_y$ layer 109 disposed on a first semiconductor layer 131. In one example, first semiconductor layer 131 comprises silicon. A plurality of pixels (e.g. red pixel 161, green pixel 163, IR pixel 165, and blue pixel 167) are disposed proximate to a front side 149 of first semiconductor layer 131. The plurality of pixels includes a first portion of pixels each of which includes first doped region 119, which is separated from $Si_xGe_y$ layer 109 by a spacer region 111. The plurality of pixels also includes a second portion of pixels, with each one of the second portion of pixels having a first doped region 120 in contact with $Si_xGe_y$ layer 109 formed proximate to a backside 151 of first semiconductor layer 131. In one example, the first portion of pixels includes red pixels 161, green pixels 163, and blue pixels 167, and the second portion of pixels includes infrared pixels 165. In one example, $Si_xGe_y$ layer 109 is n-type, spacer region 111 is p-type, and first doped region 119/120 is n-type. However, in another example, the polarity of the layers/regions may be reversed.

Pixel array 100 may also include pinning wells 113/115 disposed between individual pixels (e.g. red pixel 161, green pixel 163, IR pixel 165, and blue pixel 167). A first portion of pinning wells 113 extend through first semiconductor layer 131 and separate individual pixels. A second portion of pinning wells 115 extend through first semiconductor layer 131 and through $Si_xGe_y$ layer 109. In one example, second portion of pinning wells 115 separate groups of pixels including at least a red pixel 161, a green pixel 163, a blue pixel 167, and an infrared pixel 165. In another or the same example, pinning wells 113/115 may include p-type semiconductor.

In one example, pixel array 100 may further include a light filter layer 137, which may include red light filters 123, green light filters 125, blue light filters 129, and infrared light filters 127. In one example, red light filters 123, green light filters 125, and blue light filters 129 are positioned to transmit visible and infrared light to the first portion of pixels (e.g. red pixel 161, green pixel 163, and blue pixel 167). Infrared light filters 127 are positioned to transmit at least infrared light to the second portion of pixels (e.g. IR pixel 165). Additionally, light filter layer 137 may be arranged into a Bayer Pattern, X-Trans Pattern, EXR Pattern, or the like.

In one example, pixel array 100 may also include a capping layer 107, oxide layer 105, and carrier wafer 103. After forming second semiconductor layer 109, capping layer 107 may be formed on second semiconductor layer 109. In one example, capping layer 107 is a p+ Si capping layer. An oxide layer 105 may then be formed on capping layer 107. Oxide layer 105 may be used to secure carrier wafer 103 to the existing layers of device architecture (e.g. capping layer 107, second semiconductor layer 109, and first semiconductor layer 131). Carrier wafer 103 allows for processing of remaining device architectures.

It should be noted that other elements of optical device architecture may also be formed that are not depicted. In one example, a microlens layer (including individual microlenses) is fabricated proximate to the light filter layer 137. The microlens layer is positioned to transmit incident light through light filter layer 137, antireflection coating 135, and isolation layer 133, into the individual pixels.

Pixel array 100 is capable of detecting both visible and infrared light. As illustrated in the example depicted in FIG. 1, both visible and IR photons are directed though light filter layer 137, antireflection coating 135, isolation layer 133 and into first semiconductor layer 131.

Visible light is absorbed in first semiconductor layer 131 generating charge in first doped region 119/120. A p-n junction is formed at the interface of first doped region 119/120 and second doped region 141. In one example, first doped region 119/120 is n-type and second doped region 141 is p-type; however, in another example, the polarity of the first doped region 119/120 and second doped region 141 may be reversed. Image charge accumulated may be transferred to a floating diffusion 143 by applying a voltage to transfer gate 145. Subsequently, charge may be read out of floating diffusion 143 via conductive interconnects 147.

Conversely, IR light passes through first semiconductor layer 131 and into $Si_xGe_y$ layer 109. $Si_xGe_y$ layer 109 has a lower band gap than the silicon that may be used to form first semiconductor layer 131. Accordingly, $Si_xGe_y$ layer 109 is capable of absorbing infrared photons more efficiently. Once a photon is absorbed in $Si_xGe_y$ layer 109, charge may be transferred into first doped region 120, as first doped region 120 is in contact with $Si_xGe_y$ layer 109. A p-n junction is formed at the interface of first doped region 120 and second doped region 141. In one example, first doped region 119/120 is n-type and second doped region 141 is p-type. Image charge accumulated may be transferred to a floating diffusion 143 by applying a voltage to transfer gate 145. Subsequently, charge may be read out of floating diffusion 143 via conductive interconnects 147. This image charge may be used to from an infrared image or a hybrid visible-infrared image.

It should be noted that in other examples (not depicted), multiple pixels may share a single floating diffusion 143, including examples with two, four, six, and eight pixels all sharing the same floating diffusion 143. In examples with multiple pixels sharing the same floating diffusion 143, each pixel has its own transfer gate 145. Accordingly, charge may be read out of individual pixels one a time by applying a voltage to one transfer gate 145 at a time. Conversely, charge may be read out of multiple pixels at the same time by applying a voltage to several of the transfer gates 145 in unison.

In one example, $Si_xGe_y$ layer 109 includes silicon and germanium and is gradated such that germanium content increases in a direction. Large Ge atoms may strain a predominantly silicon lattice. Accordingly, to reduce lattice strain, Ge content is slowly increased in the direction moving away from first semiconductor layer 131. In order to achieve the gradated structure of $Si_xGe_y$ layer 109, $Si_xGe_y$ layer 109 may be grown using atomic layer deposition (ALD), chemical vapor deposition (CVD), molecular beam epitaxy (MBE), or the like. The incorporation of gradated $Si_xGe_y$ layer 109 into pixel array 100 allows for a highly sensitive IR absorption layer to be uniformly integrated into a visible and IR image sensor. This results in the formation of hybrid image sensor with superior performance and enhanced versatility of use over conventional IR imaging systems.

In one example, second $Si_xGe_y$ layer 109 may include other elements. For instance, doping $Si_xGe_y$ layer 109 with boron, nitrogen, phosphorus, arsenic, or gallium, may introduce different energy levels into the host-material band gap. Electrons can then be knocked off the dopants at energy levels well below the cutoff wavelengths for silicon or germanium, and IR detection at longer wavelengths becomes possible. In another example, $Si_xGe_y$ layer 109 may be replaced entirely with other low band gap semiconductor materials including other silicon based alloys, germanium based alloys, gallium based alloys, or the like in accordance with the teachings of the present invention. These other low bandgap semiconductor materials may also be doped with elements, including, for example, boron, nitrogen, and phosphorus.

Figure 2:
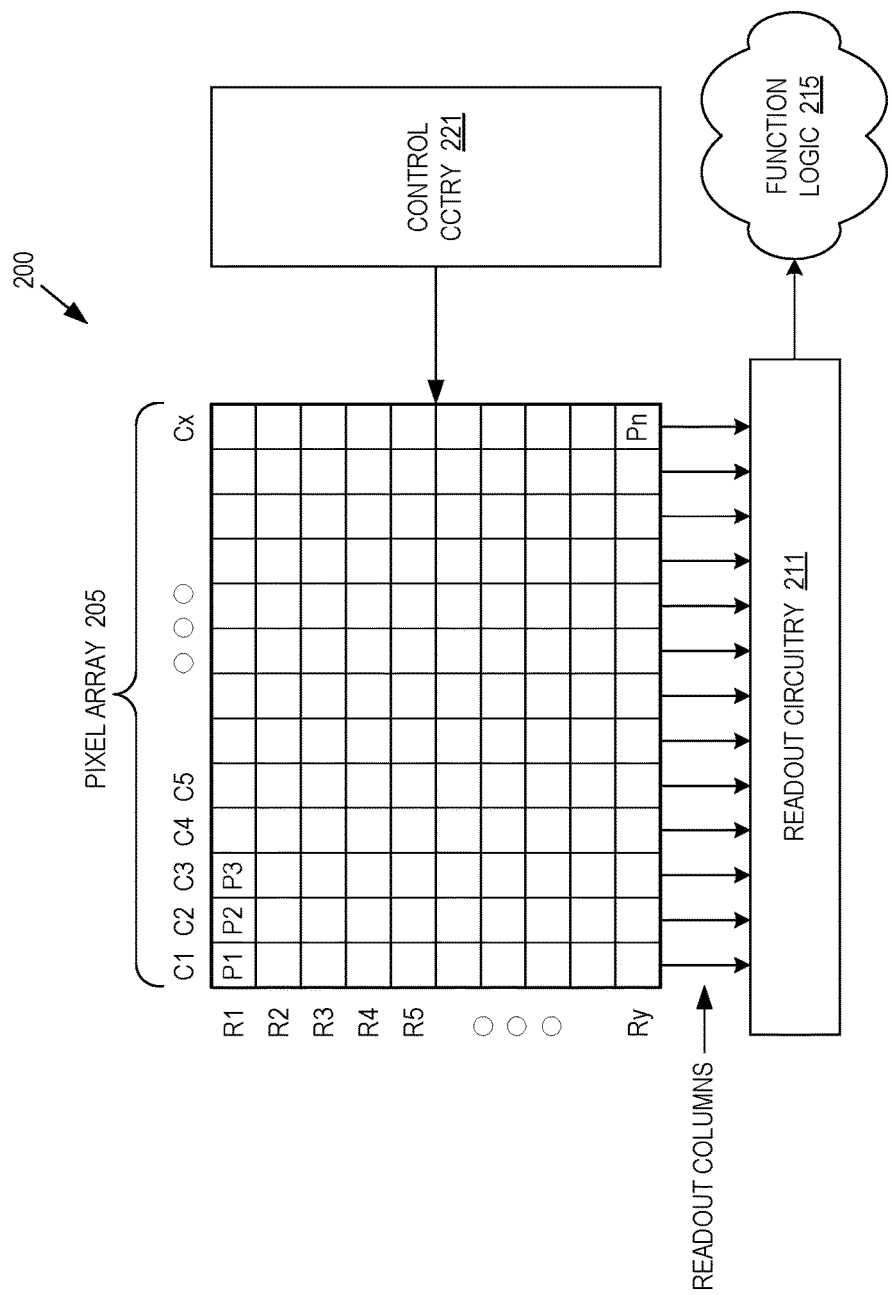
FIG. 2 is a block diagram illustrating one example of a visible and infrared image sensor, in accordance with the teachings of the present invention.

FIG. 2 is a block diagram illustrating one example of a visible and infrared image sensor 200 (hereinafter "image sensor"), in accordance with the teachings of the present invention. As shown in the depicted example, image sensor 200 includes pixel array 205, readout circuitry 211, function logic 215, and control circuitry 221. In one example, pixel array 205 is a two-dimensional (2D) array of individual pixels (e.g. pixels P1, P2 . . . , Pn) including rows (e.g. rows R1 to Ry.) and columns (e.g. column C1 to Cx). In one example, it is appreciated that the pixels P1, P2, . . . , Pn may be examples of the pixels (e.g. red pixel 161, green pixel 163, IR pixel 165, and blue pixel 167) included in pixel array 100 discussed in FIG. 1. Pixel array 205 may be used to acquire image data of a person, place, object, etc., which can then be used to render a 2D image of the person, place, object, etc. In one example, after each image sensor pixel (e.g. red pixel 161, green pixel 163, IR pixel 165, and blue pixel 167) in pixel array 205 has acquired its image data or image charge, image charge is then readout by readout circuitry 211 and transferred to function logic 215. Readout circuitry 211 is coupled to readout image data from the individual pixels in pixel array 205, and function logic 215 is coupled to readout circuitry 211 to perform logic operations on the image data. In various examples, readout circuitry 211 may include amplification circuitry, analog-to-digital (ADC) conversion circuitry, or otherwise. Function logic 215 may simply store the image data or even manipulate the image data by applying post image effects (e.g. crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the individual pixels (e.g. P1, P2, P3, etc.) in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, image sensor 200 may be included in a digital camera, cell phone, laptop computer, or the like. Additionally, image sensor 200 may be coupled to other elements of hardware such as a processor, memory elements, output (USB port, wireless transmitter, HDMI port, etc.), lighting/flash, electrical input (keyboard, touch display, track pad, mouse, microphone, etc.), and/or display. Other elements of hardware may deliver instructions to image sensor 200, extract image data from image sensor 200, or manipulate image data supplied by image sensor 200.

Figure 3:
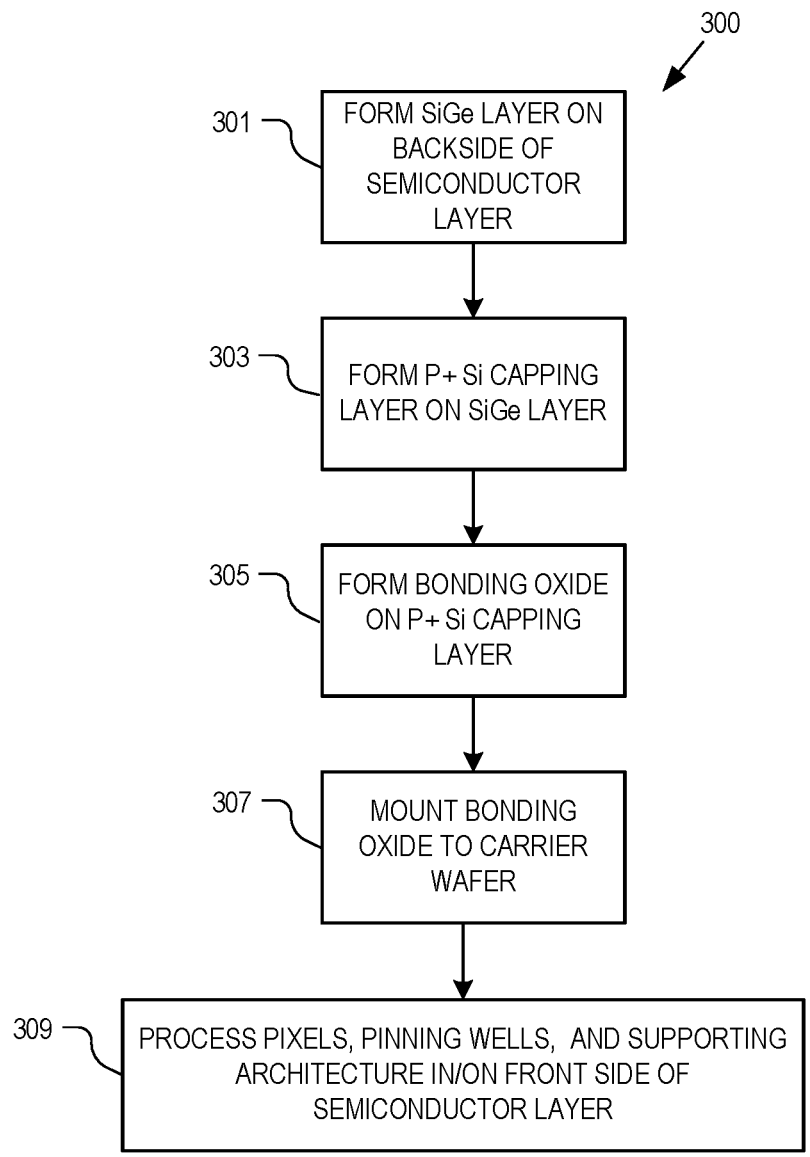
FIG. 3 is a flowchart of a process for forming a visible and infrared image sensor, in accordance with the teachings of the present invention.

FIG. 3 is a flowchart of a process 300 for forming a visible and infrared image sensor, in accordance with the teachings of the present invention. The order in which some or all of the process blocks appear in each process should not be deemed limiting. Rather, one of ordinary skill in the art having the benefit of the present disclosure will understand that some of the process blocks may be executed in a variety of orders not illustrated, or even in parallel.

Process block 301 shows forming a second semiconductor layer (e.g. $Si_xGe_y$ layer 109) on a back side (e.g. back side 151) of a first semiconductor layer (e.g. first semiconductor layer 131). In one example, the first semiconductor layer is primarily silicon and the second semiconductor layer includes SiGe. The SiGe layer may be doped with other elements, such as born, nitrogen, phosphorus, or the like. Sometimes Ge content in the second semiconductor layer is gradated such that the Ge concentration increases in a direction moving away from the first semiconductor layer. Since the SiGe lattice constant is higher than that of silicon, the SiGe layer may be prone to a higher thread dislocation density if the Ge concentration in the solid solution is increased to rapidly. The Ge in the SiGe layer is often increased at no more than 10% Ge per micron (up to a concentration of ~30% Ge), in order to prevent the formation of thread dislocations. Chemical-mechanical polishing may be used to reduce defects.

Process block 303 shows forming a capping layer (e.g. p+ Si capping layer 107) disposed proximate to the second semiconductor layer, such that the second semiconductor layer (e.g. $Si_xGe_y$ layer 109) is disposed between the first semiconductor layer (e.g. first semiconductor layer 131) and the capping layer. The capping layer will likely be strained due to the high Ge content in the back side of the second semiconductor layer (side not in contact with the first semiconductor layer). The capping layer should not be limited to just p+ Si, one skilled in the art having the benefit of the present disclosure will recognize that other materials (e.g. other semiconductors/oxides) may be used to achieve the same or a similar result.

Process block 305 illustrates forming an oxide layer (e.g. bonding oxide 105) on the p+ Si capping layer. Accordingly, the oxide layer is disposed proximate to the second semiconductor layer, and the second semiconductor layer is disposed between the first semiconductor layer and the oxide layer. In one example, the bonding oxide layer may include a semiconductor oxide or a metal oxide.

In process block 307, a carrier wafer (e.g. carrier wafer 103) is attached to the oxide layer, this allows for processing of pixel architecture in/on the first semiconductor layer. The carrier wafer may include silicon, silicon oxide, metal oxide, or the like.

Process block 309 shows processing pixels, pinning wells, and supporting architecture in/on the front side (e.g. front side 149) of the first semiconductor layer. In one example, this process includes forming one or more groups of pixels (e.g. red pixel 161, green pixel 163, IR pixel 165, and blue pixel 167) disposed in a front side of the first semiconductor layer. Forming the one or more groups of pixels may include forming a first and second portion of pixels. The first portion of pixels (e.g. red pixel 161, green pixel 163, and blue pixel 167) may be separated from the second semiconductor layer by a spacer region (e.g. spacer region 111). The second portion of pixels (e.g. IR pixel 165) may include a first doped region (e.g. first doped region 120), and the first doped region may be in contact with the second semiconductor layer. The first doped region may also be of a same majority charge carrier type as the second semiconductor layer.

Additionally, pinning wells may be formed to separate individual pixels in the one or more groups of pixels. The pinning wells (e.g. pinning wells 113) extend through the first semiconductor layer. Similarly, deep pinning wells (e.g. deep pinning wells 115) may be formed to separate the one or more groups of pixels, wherein the deep pinning wells extend through the first and second semiconductor layers.

In one example, an isolation layer (e.g. isolation layer 133) may be formed proximate to the front side of the first semiconductor layer, and the isolation layer may include conductive interconnects (e.g. conductive interconnects 147). The isolation layer may be fabricated from silicon oxide, metal oxide, a polymer, or the like. The conductive interconnects may include metal. An antireflection coating (e.g. antireflection coating 135) may also be formed such that the isolation layer is disposed between the first semiconductor layer and the antireflection coating. Additionally, a light filter layer (e.g. light filter layer 137) may be formed, and the light filter layer may include red, green, blue and infrared light filters. In one example, the light filter layer is disposed such that the antireflection coating is located between the isolation layer and the light filter layer.

As illustrated in FIG. 3, forming the second semiconductor layer may occur before forming the one or more groups of pixels. However in a different example, forming the second semiconductor layer may occur after forming at least part of the one or more groups of pixels.

Figure 4A:
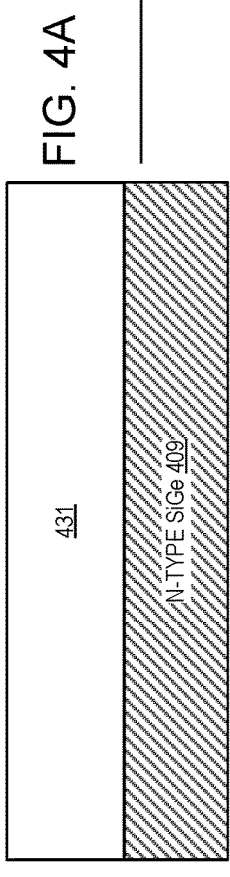
FIGS. 4A-4C show a process for forming a visible and infrared image sensor, in accordance with the teachings of the present invention.
Figure 4B:
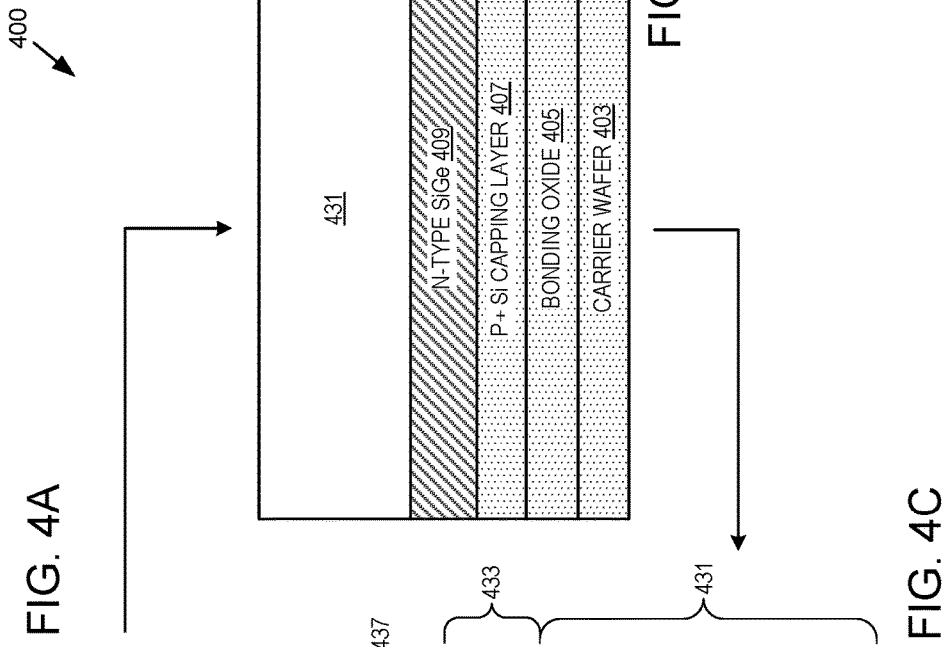
Figure 4C:
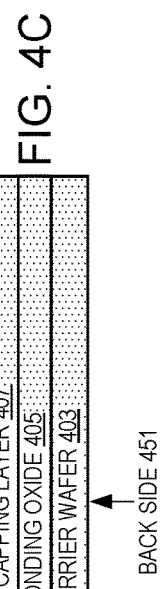

FIGS. 4A-4C show a process 400 of forming a visible and infrared image sensor, in accordance with the teachings of the present invention. It is worth noting that parts of the process 400 correspond to process blocks in process 300. The order in which some or all of the process occurs should not be deemed limiting. Rather, one of ordinary skill in the art having the benefit of the present disclosure will understand that some of the process may be executed in a variety of orders not illustrated, or even in parallel.

FIG. 4A shows forming a second semiconductor layer 409 on a back side 451 of a first semiconductor layer 431 (see process block 301). In one example, the first semiconductor layer 431 is primarily silicon and second semiconductor layer 409 includes SiGe. In one example, second semiconductor layer 409 also includes doping elements such as boron, nitrogen, phosphorus, or the like. The Ge content in second semiconductor layer 409 may be gradated and increase in a direction moving away from first semiconductor layer 431. As previously stated, Ge gradation may help to reduce dislocation density in second semiconductor layer 409.

FIG. 4B illustrates the construction of several elements of device architecture (e.g. p+ Si capping layer 407, bonding oxide 405, and carrier wafer 403) that may occur before fabricating the majority of pixel device architecture (see FIG. 4C). After forming second semiconductor layer 409, a capping layer 407 may be formed on second semiconductor layer 409. In one example, capping layer 407 is a p+ Si capping layer. An oxide layer 405 may then be formed on capping layer 407. Oxide layer 405 is used to secure carrier wafer 403 to the existing layers of device architecture (e.g. capping layer 407, second semiconductor layer 409, and first semiconductor layer 431). Carrier wafer 403 allows for processing of remaining device architectures.

FIG. 4C illustrates the processing of remaining device architecture in/on a front side 449 of the first semiconductor layer 431 (see process block 309). In one example, this process includes forming one or more groups of pixels (e.g. red pixel 461, green pixel 463, IR pixel 465, and blue pixel 467) disposed in front side 449 of the first semiconductor layer 431. Forming the one or more groups of pixels may include forming a first and second portion of pixels. The first portion of pixels (e.g. red pixel 461, green pixel 463, and blue pixel 467) are separated from the second semiconductor layer 409 by a spacer region 411. The second portion of pixels (e.g. IR pixel 465) include a first doped region 420 in contact with second semiconductor layer 409. First doped region 420 may also be of a same majority charge carrier type as second semiconductor layer 409 (e.g. both are n-type or both are p-type).

In one example, pinning wells 413 are formed to separate individual pixels in the one or more groups of pixels, wherein pinning wells 413 extend through first semiconductor layer 431. Similarly, deep pinning wells 415 may be formed to separate the one or more groups of pixels, wherein deep pinning wells 415 extend through first semiconductor layer 431 and second semiconductor layer 409.

In one example, an isolation layer 433 may be formed proximate to front side 449 of the first semiconductor layer 431, and isolation layer 433 may include conductive interconnects 447. Isolation layer 433 may be fabricated from silicon oxide, metal oxide, a polymer, or the like. Additionally, conductive interconnects 447 may include metal. An antireflection coating 435 may also be formed such that isolation layer 433 is disposed between first semiconductor layer 431 and antireflection coating 435. Light filter layer 437 may be formed and include a red light filter 423, a green light filter 425, a blue light filter 429, and an infrared light filter 427. In one example, light filter layer 437 is disposed such that antireflection coating 435 is located between isolation layer 433 and light filter layer 437. Although not depicted, light filter layer 437 may be one continuous layer, including individual light filters.

Other elements of device architecture may also be formed that are not depicted. In one example, a microlens layer (including individual microlenses) is fabricated proximate to light filter layer 437. The microlenses are positioned to transmit incident light through light filter layer 437, antireflection coating 435, and isolation layer 433, into the individual pixels.

The above description of illustrated examples of the invention, including what is described in the Abstract, is not intended to be exhaustive or to limit the invention to the precise forms disclosed. While specific examples of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of image sensor fabrication, the method comprising:
    forming a second semiconductor layer on a back side of a first semiconductor layer;
    forming one or more groups of pixels disposed in a front side of the first semiconductor layer, the one or more groups of pixels including:
        a first portion of pixels, wherein each pixel in the first portion of pixels includes a first doped region that extends through the first semiconductor layer and is separated from the second semiconductor layer by a spacer region;
        a second portion of pixels, wherein each pixel in the second portion of pixels includes the first doped region that extends through the first semiconductor layer and is in contact with the second semiconductor layer, and wherein the first doped region is of a same majority charge carrier type as the second semiconductor layer;
    pinning wells separating individual pixels in the one or more groups of pixels, wherein the pinning wells extend through the first semiconductor layer; and
    deep pinning wells separating the one or more groups of pixels, wherein the deep pinning wells extend through the first and second semiconductor layers.

2. The method of claim 1, wherein forming the second semiconductor layer comprises forming a layer including SiGe, wherein Ge content increases in a direction.

3. The method of claim 1, further comprising forming a capping layer disposed proximate to the second semiconductor layer, wherein the second semiconductor layer is disposed between the first semiconductor layer and the capping layer.

4. The method of claim 1, further comprising forming an oxide layer disposed proximate to the second semiconductor layer, wherein the second semiconductor layer is disposed between the first semiconductor layer and the oxide layer.

5. The method of claim 4 further comprising attaching a carrier wafer to the oxide layer.

6. The method of claim 1, wherein forming the second semiconductor layer occurs before forming the one or more groups of pixels.

7. The method of claim 1, wherein forming the second semiconductor layer occurs after forming at least part of the one or more groups of pixels.

8. The method of claim 1, further comprising:
    forming an isolation layer disposed proximate to the front side of the first semiconductor layer, wherein the isolation layer includes conductive interconnects;

forming an antireflection coating, wherein the isolation layer is disposed between the first semiconductor layer and the antireflection coating; and forming a light filter layer, wherein the light filter layer includes red, green, blue and infrared light filters, and wherein the antireflection coating is disposed between the isolation layer and the light filter layer.

* * * * *